(12) United States Patent
Kato et al.

(10) Patent No.: US 6,617,787 B2
(45) Date of Patent: Sep. 9, 2003

(54) LIGHT-EMITTING SYSTEM WITH ALICYCLIC EPOXY SEALING MEMBER

(75) Inventors: Hisaki Kato, Nishikasugai-gun (JP); Kanae Matsumura, Nishikasugai-gun (JP); Akira Mabuchi, Nishikasugai-gun (JP); Naoki Yoshimura, Nishikasugai-gun (JP); Kazuhiro Sakai, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 09/755,115

(22) Filed: Jan. 8, 2001

(65) Prior Publication Data

US 2001/0008484 A1 Jul. 19, 2001

(30) Foreign Application Priority Data

Jan. 11, 2000 (JP) .................................. 2000-002748

(51) Int. Cl.⁷ .................. H05B 33/00; C07D 301/03
(52) U.S. Cl. .................. 313/512; 549/540; 257/10; 257/88
(58) Field of Search ................ 313/512, 498, 313/499; 257/10, 788; 549/540, 560; 525/339, 338, 332.1

(56) References Cited

U.S. PATENT DOCUMENTS 3,336,241 A * 8/1967 Shokal
5,096,936 A   3/1992 Seko et al. ............ 522/31
5,610,443 A   3/1997 Inagaki et la. ........ 257/788
5,966,393 A * 10/1999 Hide et al. ............ 372/23
5,985,954 A * 11/1999 Tsuchida et al. ...... 523/400
6,130,344 A * 10/2000 Hara et al. ............ 549/540

FOREIGN PATENT DOCUMENTS

| DE | 199 18 580 | 10/1999 |
| EP | 0 114 258 | 8/1984 |
| JP | 56019686 | 2/1981 |
| JP | 58128756 | 8/1983 |
| JP | 59-54277 | 3/1984 |
| JP | 59108333 | 6/1984 |
| JP | 59133220 | 7/1984 |
| JP | 02169620 | 6/1990 |
| JP | 2-289611 | 11/1990 |
| JP | 5226701 | 9/1993 |
| JP | 06296044 | 10/1994 |
| JP | 8-213417 | 8/1996 |
| JP | 09213997 | 8/1997 |
| JP | 10-215004 | 8/1998 |
| JP | 10-242513 | 9/1998 |
| JP | 11029609 | 2/1999 |
| JP | 11-199645 | 7/1999 |
| JP | 1124571 | 10/1999 |

* cited by examiner

Primary Examiner—Vip Patel
Assistant Examiner—Joseph Williams
(74) Attorney, Agent, or Firm—McGinn & Gibb, PLLC

(57) ABSTRACT

An alicyclic epoxy resin is used as a material for forming a member for sealing a Group III nitride compound semiconductor light-emitting device.

18 Claims, 2 Drawing Sheets

LIGHT-EMITTING SYSTEM WITH ALICYCLIC EPOXY SEALING MEMBER

BACKGROUND OF THE INVENTION

1. Field of the Invention

The present invention relates to a light-emitting system. More particularly, it relates to improvement in a light-transmissible layer of a light-emitting system using a Group III nitride compound light-emitting device (hereinafter merely referred to as "light-emitting device") such as an LED as a light source.

The present application is based on Japanese Patent Application No. 2000-2748, which is incorporated herein by reference.

2. Description of the Related Art

In a general light-emitting system, an LED is mounted on a cup portion of a mount lead and connected to an inner lead through an electrically conductive wire, as described in JP-A-59-54277. The LED, together with the electrically conductive wire, a part of the mount lead and a part of the inner lead, is covered with a sealing member made of a light-transmissible resin. Such a configuration is employed in an LED made of Group III nitride compound semiconductors. For example, see Japanese Patent No. 2927279.

In the light-emitting system having such a configuration as described above, the sealing member is generally made of a transparent epoxy resin. JP-A-10-215004 has proposed that an epoxy resin using a curing catalyst for cationic polymerization is used as the sealing member in order to achieve prevention of deformation/destruction; prevention of electrode corrosion; facilitation of assembling; reduction of cost; and so on. The proposal has shown the case where any one of a bisphenol-A type epoxy resin, a bisphenol-F type epoxy resin and an alicyclic epoxy resin is used as the epoxy resin or a combination thereof is used as the epoxy resin.

Because JP-A-10-215004 relates to a light source for an image scanner, it is conceived that the LED to be used in JP-A-10-215004 is constituted by any other materials than the Group III nitride compound semiconductors. Although JP-A-10-215004 has described that an amine type epoxy resin is discolored under environment of use in JP-A-10-215004, it is a matter of common knowledge that weather resistance is worsened when amine is used as a curing catalyst, that is, this phenomenon is not limited when the amine type epoxy resin is used as a member for sealing an LED used as a light source.

Japanese Patent No. 2927279 discloses an epoxy resin as an example of a sealing member.

An epoxy resin is generally used as a member for sealing an LED as described above. However, there has been no specific discussion about what deteriorating phenomenon occurs when the epoxy resin is used as a member for sealing a Group III nitride compound semiconductor light-emitting device which outputs short-wave light.

SUMMARY OF THE INVENTION

An object of the present invention is to provide an epoxy resin adapted to a member for sealing a light-emitting device made of Group III nitride compound semiconductors in pursuit of characteristic of the epoxy resin used as the sealing member.

The inventors of the present invention have eagerly examined the relationship between a light-emitting device made of group III nitride compound semiconductors and an epoxy resin. As a result, the inventors have conceived an invention configured as follows. That is, a light-emitting system comprises: a Group III nitride compound semiconductor light-emitting device; and a light-transmissible layer surrounding the light-emitting device, wherein the light-transmissible layer is made of an alicyclic epoxy resin.

The light-emitting device made of Group III nitride compound semiconductors emits light with a short wavelength. Because such light with a short wavelength has high energy, deterioration (yellowing) of the epoxy resin is accelerated. Hence, when the epoxy resin is of an aromatic type, the epoxy resin satisfies physical properties such as curing speed, hardness, etc. of a sealing member but it is difficult to obtain sufficient durability because the double bond of the epoxy resin serves as an active seed so that the epoxy resin is affected by light emitted from the light-emitting device. For example, there is a possibility that a bisphenol-A type epoxy resin is denatured to quinoid (brown) by light. On the other hand, an aliphatic epoxy resin has sufficient durability against light but is unsuitable as a sealing member in terms of physical properties such as remarkably high curing speed, large distortion after curing, etc.

In this respect, an alicyclic epoxy resin is hardly deteriorated (yellowed) even in the case where the alicyclic epoxy resin is disposed in proximity of the Group III nitride compound semiconductor light-emitting device because the alicyclic epoxy resin has no double bond as an active seed. Also from the point of view of physical properties, the alicyclic epoxy resin is used sufficiently as a member for sealing the light-emitting device though the alicyclic epoxy resin does not amount, in physical properties, to the aromatic epoxy resin.

As a result of eager investigation by the inventors of the present invention, it has been found that an epoxy resin composition proposed in JP-A-11-199645 is used preferably as the aforementioned alicyclic epoxy resin. The proposed epoxy resin is a hydrogenated epoxy resin prepared by hydrogenation of an aromatic epoxy resin and having an alicyclic hydrogenating ratio of not lower than 85%, an epoxy group loss ratio of not higher than 20% and a total chlorine content of not larger than 0.3% by weight.

In this paragraph, related matters will be quoted from JP-A-11-199645 in order to clarify the disclosure of the invention.

(1) The present invention relates to an epoxy resin composition containing (A) a hydrogenated epoxy resin prepared by hydrogenation of an aromatic epoxy resin and having an aromatic ring hydrogenating ratio of not lower than 85%, an epoxy group loss ratio of not higher than 20% and a total chlorine content of not larger than 0.3% by weight, and (B) an epoxy resin curing agent.

(2) The present invention relates to the epoxy resin composition according to (1), wherein 0.01 to 200 parts by weight of the epoxy resin curing agent are mixed with 100 parts by weight of the hydrogenated epoxy resin.

(3) The present invention relates to the epoxy resin composition according to (1) or (2), wherein the hydrogenated epoxy resin is a hydrogenated epoxy resin prepared by dissolution of an aromatic epoxy resin in an ether solvent and hydrogenation of the aromatic epoxy resin under pressure and under presence of a catalyst composed of graphite, and rhodium or ruthenium carried by the graphite.

(4) The present invention relates to the epoxy resin composition according to any one of (1) through (3), wherein the hydrogenated epoxy resin is a liquid epoxy resin prepared by hydrogenation of a bisphenol-A type epoxy resin and having a viscosity of not higher than 2.5 Pa·s at 25° C. when measured by a rotaviscometer.

(5) The present invention relates to the epoxy resin composition according to any one of (1) through (3), wherein the hydrogenated epoxy resin is an epoxy resin prepared by hydrogenation of a novolac epoxy resin having an epoxy equivalent amount in a range of from 150 to 230 and represented by the following general formula:

[Formula 1]

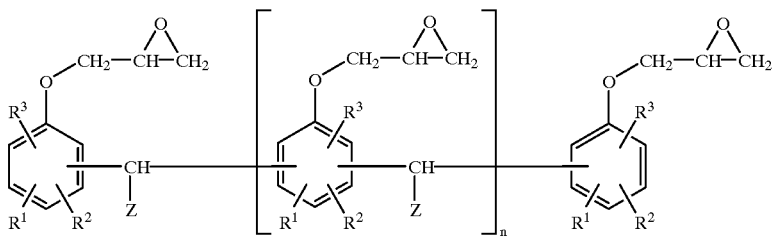

in which each of R1, R2 and R3 shows a hydrogen atom or an alkyl group having 1 to 4 carbon atoms, n shows a numerical value of from 0 to 10, and z shows a hydrogen atom or the formula:

[Formula 2]

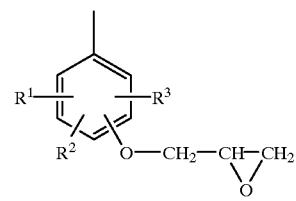

in which each of R1, R2 and R3 shows a hydrogen atom or an alkyl group having 1 to 4 carbon atoms.

(6) The present invention relates to the epoxy resin composition according to any one of (1) through (5), wherein the hydrogenated epoxy resin has a total chlorine content of not larger than 0.3% by weight and a hydrolytic chlorine content of not larger than 0.1% by weight.

(7) The present invention relates to the epoxy resin composition according to any one of (1) through (6), wherein the epoxy resin curing agent is a compound selected from the group consisting of amines, acid anhydrides, polyhydricphenols, imidazoles, protonates, dicyandiamides, organic acid hydrazides, polymercaptans, and organic phosphines.

(8) The present invention relates to the epoxy resin composition according to any one of (1) through (7), wherein the epoxy resin curing agent has an aromatic ring content of not larger than 10% by weight with respect to the total amount of the curing agent.

Features and advantages of the invention will be evident from the following detailed description of the preferred embodiments described in conjunction with the attached drawings.

DETAILED DESCRIPTION OF THE PREFERRED EMBODIMENTS

Figure 1:
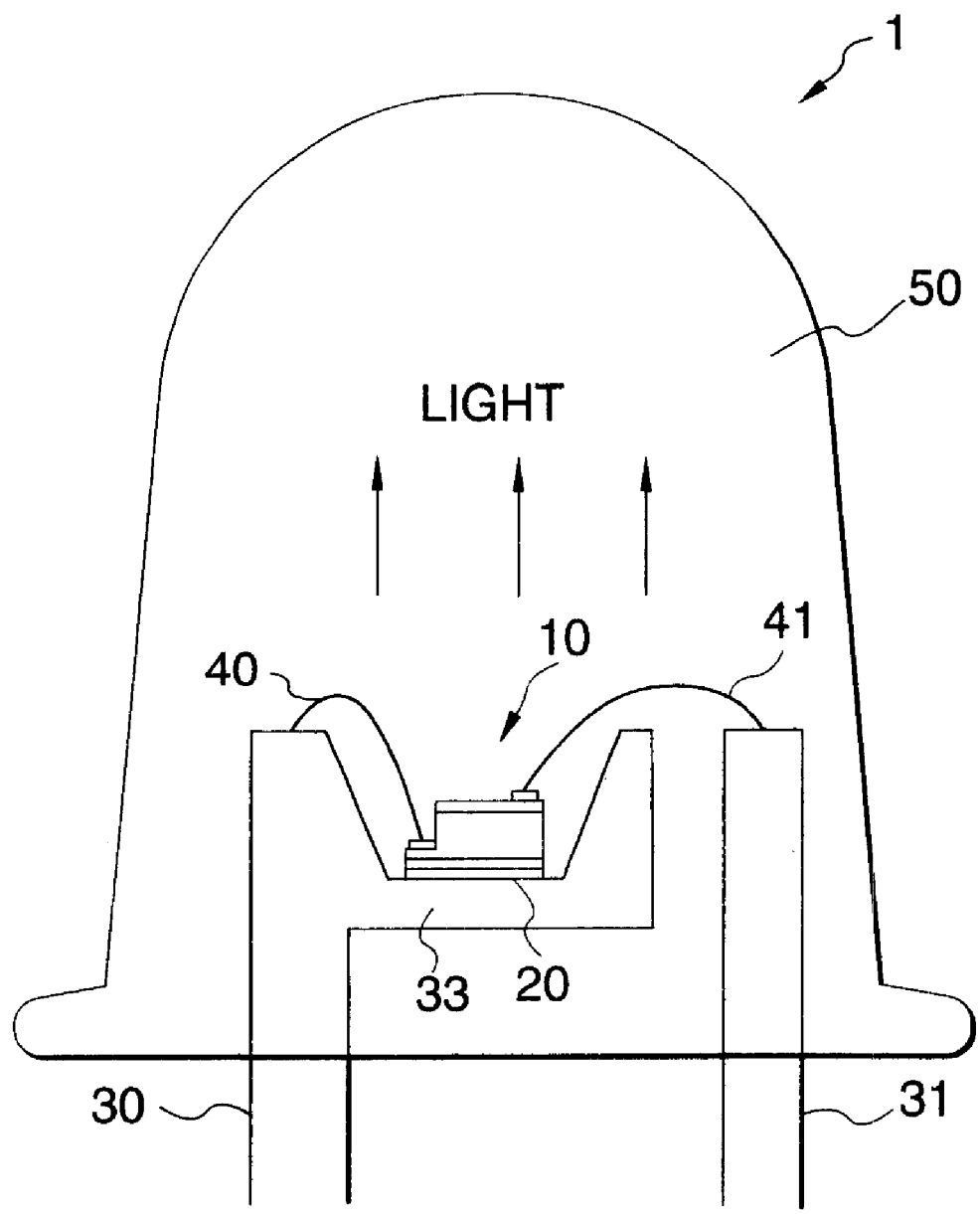
FIG. 1 shows a light-emitting system according to an embodiment of the present invention.

The present invention will be described below in detail.

Component (A): Hydrogenated Epoxy Resin

The hydrogenated epoxy resin as component (A) in the present invention is an epoxy resin prepared by a hydrogenating reaction of an aromatic epoxy resin and having an aromatic ring hydrogenating ratio of not lower than 85%, an epoxy group loss ratio of not higher than 20% and a total chlorine content of not larger than 0.3% by weight. The hydrogenating ratio of aromatic rings in the epoxy resin is a ratio by which the aromatic rings are changed to aliphatic rings. The aromatic ring hydrogenating ratio can be measured by nuclear magnetic resonance analysis. The epoxy group loss ratio is a ratio by which epoxy groups are hydro-cracked. The epoxy group loss ratio can be measured by titration of perchloric acid. The total chlorine content is the total amount of organic chlorine and inorganic chlorine contained in the epoxy resin. The total chlorine content can be measured by titration of silver nitrate after a reaction of biphenyl sodium with chlorine in the epoxy resin.

When the hydrogenated epoxy resin as component (A) is used as a material for sealing electronic parts, the hydrogenated epoxy resin preferably has a hydrolytic chlorine content of not larger than 0.1% by weight. If the aromatic ring hydrogenating ratio is lower than 85%, it is undesirable that the weather resistance of the cured epoxy resin is lowered extremely. If the epoxy group loss ratio is higher than 20%, it is undesirable that the heat resistance of the cured epoxy resin is lowered extremely. If the total chlorine content is larger than 0.3% by weight, the epoxy resin is unsuitable as an epoxy resin for electric/electronic materials because the moisture resistance, high-temperature electric characteristic and weather resistance of the epoxy resin are lowered.

Method for Producing Hydrogenated Epoxy Resin

The hydrogenated epoxy resin as component (A) in the present invention is prepared by a selective hydrogenating reaction of an aromatic epoxy resin under pressure and under presence of a catalyst. Examples of the aromatic epoxy resin may include: bisphenol epoxy resins such as bisphenol-A diglycidyl ether, bisphenol-F diglycidyl ether, bisphenol-S diglycidyl ether, etc.; novolac epoxy resins such as phenol novolac epoxy, cresol novolac epoxy, hydroxybenzaldehyde phenol novolac epoxy, etc.; and multifunctional epoxy resins such as tetrahydroxyphenylmethane glycidyl ether, tetrahydroxybenzophenone glycidyl ether, epoxydized polyvinyl phenol, etc.

Among these materials, bisphenol-A epoxy resins and novolac epoxy resins represented by the general formula (1) are used preferably from the point of view of low chlorine content.

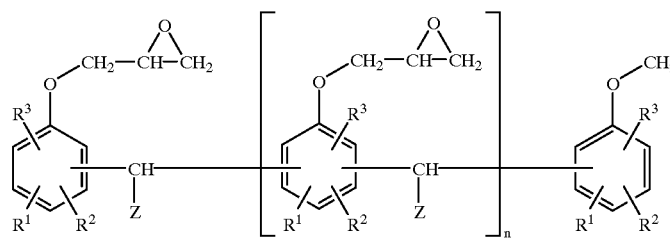

[Formula 1]

in which each of R1, R2 and R3 shows a hydrogen atom or an alkyl group having 1 to 4 carbon atoms, $\underline{n}$ shows a numerical value of from 0 to 10, and Z shows a hydrogen atom or the formula:

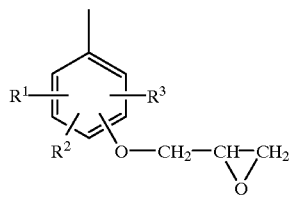

[Formula 2]

in which each of R1, R2 and R3 shows a hydrogen atom or an alkyl group having 1 to 4 carbon atoms.

For the purpose of use particularly requiring good balance between heat resistance and moisture resistance, there are preferably used hydrogenated bisphenol-A epoxy resins having a viscosity of not higher than 2.5 Pa·s at 25° C. when measured by a rotaviscometer and novolac epoxy resins represented by the general formula (1), especially epoxy resins produced by hydrogenation of aromatic epoxy resins each having an hydrogen atom or a methyl group as each of R1, R2 and R3 and having an epoxy equivalent amount in a range of from 150 to 230.

The method for producing the hydrogenated epoxy resin as component (A) in the present invention is as follows. Aromatic rings are selectively hydrogenated by use of an ether type organic solvent such as tetrahydrofuran, dioxane, etc. under presence of a catalyst composed of graphite (hexagonal graphite) and rhodium or ruthenium carried by the graphite. A carrier having a surface area in a range of from 10 m$^2$/g to 400 m$^2$/g inclusively is used as the graphite. The reaction is performed under pressure in a range of from 1 to 30 Mpa at a temperature in a range of from 30 to 150° C. for a reaction time in a range of from 1 to 20 hours. After the reaction is completed, the catalyst is removed by filtration and the ether type organic solvent is fractionated under decompression till the ether type organic solvent is substantially eliminated. Thus, a hydrogenated epoxy resin is obtained.

Component (B): Epoxy Resin Curing Agent

The hydrogenated epoxy resin as component (A) in the present invention can be cured by use of an epoxy resin curing agent. An available epoxy resin curing agent is used as the epoxy resin curing agent which is component (B). Examples of the epoxy resin curing agent may include as follows.

(1) Amines: aliphatic and alicyclic amines such as diethylenetriamine, triethylenetetramine, tetraethylenepentamine, N-aminoethylpiperazine, isophoronediamine, bis(4-aminocyclohexyl)methane, bis (aminomethyl)cyclohexane, m- xylylenediamine, 3,9-bis(3-aminopropyl)-2,4,8,10-tetraspiro[5,5] undecane, etc.; aromatic amines such as metaphenylenediamine, diaminodiphenylmethane, diaminodiphenylsulfone, etc.; and tertiary amines and their salts such as benzyldimethylamine, 2,4,6-tris (dimethylaminomethyl)phenol, 1,8-diazabicyclo(5,4,0) undeccene-7, 1,5-diazabicyclo(4,3,0)nonene-5, etc.

(2) Acid anhydrides: aromatic acid anhydrides such as phthalic anhydride, trimellitic anhydride, pyromellitic anhydride, etc.; and cyclic fatty acid anhydrides such as tetrahydrophthalic anhydride, methyltetrahydrophthalic anhydride, hexahydrophthalic anhydride, methylhexahydrophthalic anhydride, methylendomethylenetetrahydrophthalic anhydride, dodecenylsuccinic anhydride, trialkyltetrahydrophthalic anhydride, etc.

(3) Polyhydric phenols: catechol, resorcin, hydroquinone, bisphenol-F, bisphenol-A, bisphenol-S, bisphenol, phenol novolacs, cresol novolacs, novolacs of dihydric phenols such as bisphenol-A, trishydroxyphenylmethanes, aralkylpolyphenols, dicyclopentadienepolyphenols, etc.

(4) Polyaminoamides: polyaminoamide prepared by a condensating reaction of dimer acid with amines shown in (1), such as Versamid (Trade Name) 140, 125 (Grade Name) made by Henkel Japan Ltd.

(5) Others: imidazole compounds and their salts such as 2-methylimidazole, 2-ethyl-4-imidazole, 2-phenylimidazole, etc.; BF3 complex compounds of amines; Bronsted acid salts such as aliphatic sulfonium salt, aromatic sulfonium salt, etc.; dicyandiamides; organic acid hydrazides such as dihydrazide adipate, dihydrazide phthalate, etc.; polymercaptans; and organic phosphines such as triphenylphosphine, etc.

These epoxy resin curing agents may be used singly or in combination.

The aforementioned epoxy resin curing agent is preferably used so that the aromatic ring content is not larger than 10% by weight with respect to the total amount of the curing agent. If the aromatic ring content is larger than 10% by weight, the weather resistance of the cured epoxy resin is undesirably lowered. The hydrogenated epoxy resin as component (A) and the epoxy resin curing agent as component (B) are mixed with each other in proportion of 0.01 to 200 parts by weight, preferably 0.1 to 150 parts by weight of the epoxy resin curing agent as component (B) with respect to 100 parts by weight of the hydrogenated epoxy resin as component (A). If proportion is out of the aforementioned range, the balance between heat resistance and moisture resistance of the cured epoxy resin is worsened undesirably.

Optional Components

The following components may be added to the epoxy resin composition in the present invention as occasion demands.

(1) Powder-like reinforcing agents and fillers. For example, metal oxides such as aluminum oxide, magnesium oxide, etc.; metal carbonates such as calcium carbonate, magnesium carbonate, etc.; silicon compounds such as diatomaceous earth powder, basic magnesium silicate, calcined clay, impalpable powder silica, molten silica, crystalline silica, etc.; metal hydroxides such as aluminum hydroxide, etc.; and others such as kaolin, mica, quartz powder, graphite, molybdenum disulfide, etc. Fibrous reinforcing agents and fillers. For example, glass fiber, ceramic fiber, carbon fiber, alumina fiber, silicon carbide fiber, boron fiber, polyester fiber, polyamide fiber, etc. These materials may be mixed with the epoxy resin in proportion of 10 to 90 parts by weight with respect to 100 parts by weight of the sum of the epoxy resin and the curing agent.

(2) Colorants, pigments and fire retardants. For example, titanium dioxide, iron black, molybdenum red, iron blue, ultramarine blue, cadmium yellow, cadmium red, antimony trioxide, red phosphorus, bromine compound, triphenyl phosphate, etc. These are mixed with the epoxy resin in proportion of 0.1 to 20 parts by weight with respect to 100 parts by weight of the sum of the epoxy resin and the curing agent.

(3) Various curable monomers, oligomers and synthetic resins may be mixed in order to improve the properties of the resin in a final coating, an adhesive layer, a molded product etc. For example, epoxy resin diluent such as monoepoxy, phenol resin, alkyd resin, melamine resin, fluororesin, vinyl chloride resin, acrylic resin, silicone resin, polyester resin, etc. may be used singly or in combination. These resins are preferably mixed in proportion that the original properties of the resin composition according to the present invention are not spoiled, that is, in proportion of 50 parts by weight or less with respect to 100 parts by weight of the sum of the epoxy resin and the curing agent. Examples of means for mixing the epoxy resin, the epoxy resin curing agent and the optional components in the present invention may include hot-melting mixture, melting kneading due to a roll or kneader, wet or dry mixture due to use of a suitable organic solvent, etc.

When the epoxy resin is viewed as a member for sealing the Group III nitride compound semiconductor light-emitting device, it is conceived that yellowing is caused by the influence of the curing agent as well as the double bond in molecules.

As described above, yellowing is accelerated when an amine type curing agent is used. It is conceived that the acceleration of yellowing is caused diazo formed by denaturation of amine. In an acid anhydride curing agent, the carbonyl group contained in the curing agent serves as an active seed to thereby cause yellowing of the epoxy resin.

Therefore, the inventors of the present invention determine use of a cationic polymerization catalyst. When the cationic polymerization catalyst is used, epoxy rings are cleaved. As a result, epoxy groups react with each other to thereby form ether bonds. Because the cationic polymerization catalyst generally has neither active seed nor functional seed, the catalyst is inactive to light emitted from the Group III nitride compound semiconductor light-emitting device even in the case where the catalyst remains in the epoxy resin.

A known catalyst such as sulfonium salt, ammonium salt, phosphonium salt, onium salt, silanol-aluminum complex, etc. may be used as the cationic polymerization catalyst. For example, cationic polymerization catalysts disclosed in Japanese Patent No. 2875479, JP-A-2-289611 and JP-A-11-29609 may be used.

It is more preferable to use a sulfonium salt type cationic polymerization catalyst.

Although the amount of the cationic polymerization catalyst depends on the performance of the catalyst, it is preferable that 0.1 to 5.0% by weight of the catalyst is mixed with the epoxy resin. More preferably, 0.5 to 1.5% by weight of the catalyst is mixed.

The epoxy resin prepared as described above forms a light-transmissible sealing member surrounding the light-emitting device. The shape of the sealing member is not particularly limited but the sealing member is preferably shaped like an artillery shell to obtain a lens effect. All portions of the sealing member need not be formed from the epoxy resin according to the present invention. A circumferential portion of the light-emitting device where deterioration advances most rapidly may be formed from the epoxy resin according to the present invention but the other portion may be formed from another light-transmissible material.

The Group III nitride compound semiconductor light-emitting device to be used in the light-emitting system according to the present invention is adapted to a device emitting light with a relatively short wavelength inclusive of a peak wavelength of not larger than 550 nm. More preferably, the peak wavelength is selected to be in a range of from 360 to 400 nm. A light emitting diode or a laser diode may be used as the light emitting device. A homostructure, a heterostructure or a double heterostructure having an MIS junction, a PIN junction or a p-n junction may be used as the configuration of the light-emitting device. A quantum well structure (single quantum well structure or multiple quantum well structure) maybe also used as the light-emitting device.

Incidentally, Group III nitride compound semiconductors are represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_XGa_{1-X}N$, $Al_XIn_{1-X}N$ and $Ga_XIn_{1-X}N$ ($0 \leq X \leq 1$ each). The Group III elements may be partially replaced by boron (B), thallium (Tl), etc. The nitrogen (N) maybe partially replaced by phosphorus (P), arsenic (As), antimony (Sb), bismuth (Bi), etc. Each of the group III nitride compound semiconductors may contain any optional dopant. Si, Ge, Se, Te, C, etc. may be used as n-type impurities. Mg, Zn, Be, Ca, Sr, Ba, etc. may be used as p-type impurities. Incidentally, after doped with p-type impurities, the Group III nitride compound semiconductor may be subjected to electron beam irradiation, plasma irradiation or heat due to a furnace. The method of forming the group III nitride compound semiconductor is not particularly limited but may be formed by a metal organic chemical vapor deposition method (MOCVD method) or by a known method such as a molecular beam epitaxy method (MBE method), a halide vapor phase epitaxy method (HVPE method), a sputtering method, an ion-plating method, an electron shower method, or the like. The substrate is not particularly limited so long as a Group III nitride compound semiconductor can be grown on the substrate. Examples of the substrate material may include sapphire, spinel, silicon, silicon carbide, zinc oxide, gallium phosphide, gallium arsenide, magnesium oxide, manganese oxide, Group III nitride compound semiconductor single crystal, etc. According to the examination by the present inventors, it is preferable to use sapphire, especially face a thereof, as the substrate. To form a Group III nitride compound semiconductor with good crystallinity, a buffer layer is preferably formed on the sapphire substrate so that lattice mismatching therewith is corrected. A quarternary compound semiconductor represented by $Al_XGa_YIn_{1-X-Y}N$ ($0<X<1$, $0<Y<1$, $0<X+Y<1$), a ternary compound semiconductor represented by $Al_XGa_{1-X}N$ ($0<X<1$) or AlN, GaN or InN can be used as the buffer layer.

Various additives may be mixed with the epoxy resin according to the present invention. Examples of the additives may include reinforcing agents, fillers, colorants, pigments, fire retardants, etc. as described above.

The following fluorescent substances may be added as additives. That is, at least one fluorescent substance selected from the group consisting of ZnS:Cu, Au, Al; ZnS:Cu, Al; ZnS:Cu; ZnS:Mn; ZnS:Eu; $YVO_4$:Eu; $YVO_4$:Ce; $Y_2O_2S$:Eu; and $Y_2O_2S$:Ce is used. ZnS:Cu, Au, Al is a ZnS photoluminescence fluorescent substance containing ZnS as a parent body activated by Cu, Au and Al. ZnS:Cu, Al; ZnS:Cu; ZnS:Mn and ZnS:Eu are photoluminescence fluorescent substances containing ZnS as a parent body activated by Cu and Al, Cu, Mn, and Eu, respectively. Similarly, $YVO_4$:Eu and $YVO_4$:Ce are fluorescent substances containing $YVO_4$ as a parent body activated by Eu and Ce respectively. $Y_2O_2S$:Eu and $Y_2O_2S$:Ce are fluorescent substances containing $Y_2O_2$ as a parent body activated by Eu and Ce respectively. These fluorescent substances have absorption spectra for a range of from blue light to green light. Each of the fluorescent substances emits light with a wavelength longer than the excitation wavelength.

Among the above fluorescent substances, ZnS:Eu, $YVO_4$:Ce and $Y_2O_2S$:Ce have a long emission wavelength for excitation light in a range of from blue light to green light compared with the other fluorescent substances. That is, the color of light emitted from these fluorescent substances is redder. As a result, the color of light obtained by mixture of light emitted from the fluorescent substances and light emitted from the light-emitting device as a primary light source is near to white. To obtain the color of emitted light nearer to white as described above, at least one fluorescent substance is preferably selected from the group consisting of ZnS:Eu, $YVO_4$:Ce and $Y_2O_2S$:Ce.

Alternatively, CaS:Eu can be also used as the fluorescent substance. According to the fluorescent substance, red fluorescence is obtained.

Further, an yttrium-aluminum-garnet fluorescent substance activated by cerium may be used as described in Japanese Patent No. 2927279. Activation by cerium may be omitted. In the yttrium-aluminum-garnet fluorescent substance, yttrium may be partially or wholly replaced by at least one element selected from the group consisting of Lu, Sc, La, Gd, and Sm or aluminum may be partially or wholly replaced by either or both of Ga and In. More specifically, $(RE_{1-x}Sm_x)_3(Al_yGa_{1-y})_5O_{12}$:Ce ($0 \leq x<1$, $0 \leq y<1$, RE being at least one selected from the group consisting of Y and Gd) may be used. In this case, it is preferable that light emitted from the Group III nitride compound semiconductor light-emitting device has a peak wavelength in a range of from 400 to 530 nm.

The present invention will be described below more in detail on the basis of Examples.

An LED with a peak wavelength of 382 nm provided by TOYODA GOSEI Co., Ltd. (Applicant) was used as a light-emitting device made of Group III nitride compound semiconductors. The configuration of the LED was as follows.

| Layer | Composition | Dopant | (Thickness) |
| --- | --- | --- | --- |
| p-type clad layer | n-GaN | Si | (0.3 µm) |
| Light-emitting layer | Superlattice structure | | |
| Quantum well layer | $In_{0.07}Ga_{0.93}N$ | | (3.5 nm) |
| Barrier layer | GaN | | (3.5 nm) |
| Number of repeated quantum well and barrier layers: 1 to 10 | | | |
| n-type clad layer | p-GaN | Mg | (4 µm) |
| Buffer layer | AlN | | (15 nm) |
| Substrate | Sapphire | | (300 µm) |

The p-type clad layer, the light-emitting layer and the n-type clad layer were partially etched to thereby form a bonding pad for the n-type clad layer. A transparent electrode was formed on the upper surface of the p-type clad layer. A bonding pad was formed thereon.

The LED configured as described above was formed by a known MOCVD method.

As shown in FIG. 1, an LED chip 10 was fixed on a cup portion 33 of a mount lead 30 through silver paste 20. The n-type electrode of the LED chip 10 was electrically connected to the mount lead 30 through an electrically conductive wire 40. The p-type electrode of the LED chip 10 was electrically connected to an inner lead 31 through an electrically conductive wire 41. The LED chip 10 thus formed was surrounded by a sealing member 50 obtained in each of Examples and Comparative Examples which will be described above. At room temperature, a current of 20 mA was made to flow continuously in the LED chip 10, and the change with time of the light emitting intensely on the optical axis indicated by arrow in FIG. 1.

The composition of the resin in each of Examples and Comparative Examples was as follows. Incidentally, each numerical value in the table parts is expressed in parts by weight.

EXAMPLE 1

The epoxy resin composition in Example 1 was prepared by mixing an acid anhydride curing catalyst with bisphenol-A (hereinafter referred to "hydrogenated bis-A") hydrogenated to change aromatic double bonds to aliphatic rings. Details were as follows.

| | |
|---|---|
| Epikoto YL-6663[1] | 70 |
| Celloxide 2021[2] | 30 |
| 4-methylhexaphthalic anhydride | 95 |
| zinc octylate | 1 |

[1]hydrogenated bis-A type epoxy resin with an epoxy equivalent amount of 205 (g/eq), made by JAPAN EPOXY RESINS COMPANY, LTD.
[2]aliphatic epoxy resin with an epoxy equivalent amount of 133 (g/eq), made by DAICEL CHEMICAL INDUSTRIES, LTD.

EXAMPLE 2

The epoxy resin composition in Example 2 was prepared by mixing an acid anhydride curing catalyst with another type hydrogenated bis-A. Details were as follows.

| | |
|---|---|
| Epikoto YL-6663 | 30 |
| Celloxide 2021 | 70 |
| 4-methylhexaphthalic anhydride | 95 |

EXAMPLE 3

The epoxy resin composition in Example 3 was prepared by mixing a one-liquid type cationic polymerization catalyst with the same hydrogenated bis-A as in Example 1. Details were as follows.

| | |
|---|---|
| Epikoto YL-6663 | 100 |
| Sunaid S1-100L[3] | 1.5 |

[3]sulfonium salt type cationic polymerization catalyst made by SANSIN CHEMICAL INDUSTRY CO., LTD.

COMPARATIVE EXAMPLE 1

In Comparative Example 1, the sealing member was not formed so that the LED chip was exposed.

COMPARATIVE EXAMPLE 2

In Comparative Example 2, the sealing member was formed from a hollow artillery shell-shaped cap made of glass.

COMPARATIVE EXAMPLE 3

The epoxy resin composition in Comparative Example 3 was prepared by mixing an acid anhydride curing catalyst with a blend of an aromatic compound and an aliphatic compound. Details were as follows.

| | |
|---|---|
| Epikoto 828[4] | 60 |
| Celloxide 2021 | 40 |
| 4-methylhexaphthalic anhydride | 100 |
| zinc octylate | 1 |

[4]bisphenol-A type epoxy resin with an epoxy equivalent amount of 189 (g/eq), made by JAPAN EPOXY RESINS COMPANY, LTD.

Figure 2:
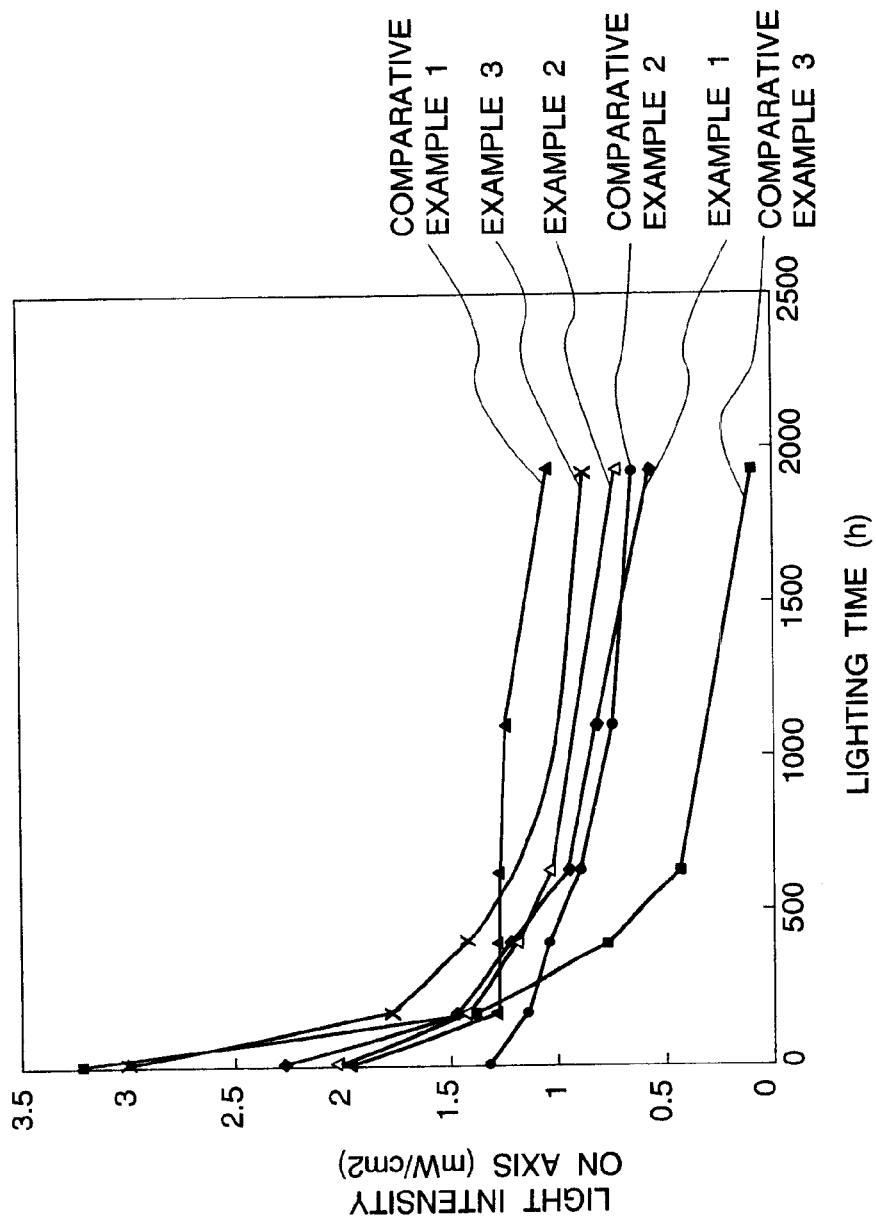
FIG. 2 is a graph showing the change with the passage of time, of the intensity of light emitted from the light-emitting system in each of Examples and Comparative Examples.

It is apparent from FIG. 2 that the sealing member made of an alicyclic epoxy resin in each of Examples exhibits smaller lowering of the intensity of emitted light than the epoxy resin (Comparative Example 3) containing an aromatic compound. That is, deterioration (yellowing) was so little that the sealing member exhibits characteristic equal to the characteristic of that made of glass even in the case where an acid anhydride polymerization catalyst having a carbonyl group capable of serving as an active seed is used (Examples 1 and 2). Moreover, the degree of deterioration is further lightened when a cationic polymerization catalyst having no active seed is used as a polymerization catalyst (Example 3).

The present invention is not limited to the description of the mode for carrying out the invention and the embodiment thereof at all, and includes various modifications that can be conceived easily by those skilled in the art without departing the scope of claim.

What is claimed is:

1. A light-emitting system, comprising:
   a Group III nitride compound semiconductor light-emitting device; and
   a light-transmissible layer surrounding said light-emitting device;
   wherein said light-transmissible layer comprises a substantially alicyclic epoxy resin having an aromatic ring hydrogenation ratio of not lower than 85%; and
   wherein said light-transmissible layer is cationically-polymerized.

2. A light-emitting system according to claim 1, wherein said substantially alicyclic epoxy resin is a hydrogenated aromatic epoxy resin having an epoxy group loss ratio of not higher than 20% and a total chlorine content of not higher than 0.3% by weight.

3. A light-emitting system according to claim 1, wherein light emitted from said light-emitting device has a wavelength of not larger than 550 nm.

4. A sealing member for surrounding a Group III nitride compound semiconductor light-emitting device, comprising a substantially alicyclic epoxy resin having an aromatic ring hydrogenation ratio of not less than 85%;
   wherein said substantially alicyclic epoxy resin is cationically-polymerized; and
   wherein said sealing member is shaped to surround at least a portion of the Group III nitride semiconductor light-emitting device.

5. A sealing member according to claim 4, wherein said substantially alicyclic epoxy resin is a hydrogenated aromatic epoxy resin having an epoxy group loss ratio of not higher than 20% and a total chlorine content of not higher than 0.3% by weight.

6. A sealing member according to claim 4, wherein light emitted from said light-emitting device has a wavelength of not larger than 550 nm.

7. A light-emitting system according to claim 2, wherein the hydrogenated aromatic epoxy resin comprises one or more members selected from the group consisting of a bisphenol epoxy resin, a novolac epoxy resin and a multifunctional epoxy resin.

8. A light-emitting system according to claim 7, wherein the hydrogenated aromatic epoxy resin comprises a resin of the general formula:

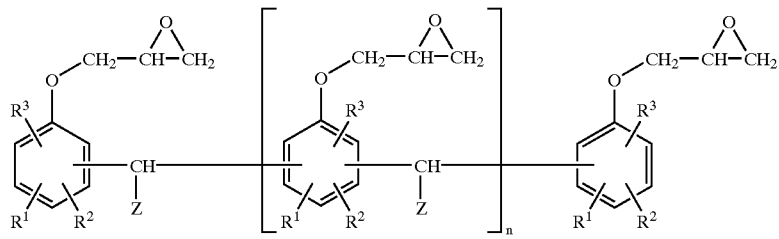

wherein $R^1$, $R^2$, and $R^3$ are each independently a hydrogen atom or an alkyl group having 1 to 4 carbon atoms, n is an integer from 0 to 10, and Z is a hydrogen atom or a group having the formula:

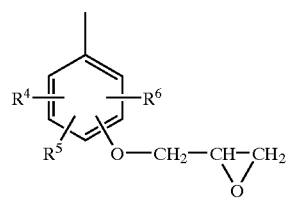

wherein $R^4$, $R^5$, and $R^6$ are each independently a hydrogen atom or an alkyl group having 1–4 carbon atoms.

9. A sealing member according to claim 4, wherein the hydrogenated aromatic epoxy resin comprises one or more members selected from the group consisting of a bisphenol epoxy resin, a novolac epoxy resin and a multifunctional epoxy resin.

10. A sealing member according to claim 9, wherein the hydrogenated aromatic epoxy resin comprises a resin of the general formula:

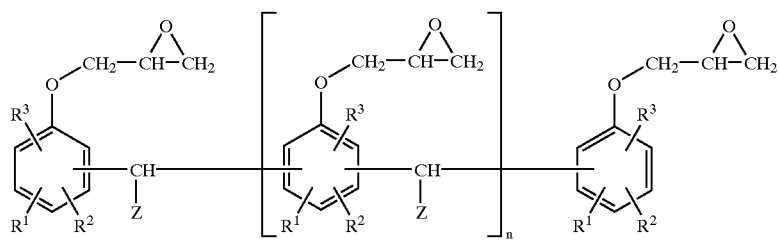

wherein $R^1$, $R^2$, and $R^3$ are each independently a hydrogen atom or an alkyl group having 1 to 4 carbon atoms, n is an integer from 0 to 10, and Z is a hydrogen atom or a group having the formula:

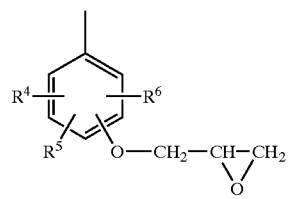

wherein $R^4$, $R^5$, and $R^6$ are each independently a hydrogen atom or an alkyl group having 1–4 carbon atoms.

11. A sealing member comprising a hydrogenated aromatic epoxy resin having an aromatic ring hydrogenation ratio of not less than 85%, the hydrogenated aromatic epoxy resin comprising one or more members selected from the group consisting of a bisphenol epoxy resin, a novolac epoxy resin and a multifunctional epoxy resin;

wherein said aromatic epoxy resin is cationically-polymerized; and wherein said sealing member is shaped to surround at least a portion of a Group III nitride compound semiconductor light-emitting device.

12. A sealing member according to claim 11, wherein the hydrogenated aromatic epoxy resin has an epoxy group loss ratio of not higher than 20% and a total chlorine content of not higher than 0.3% by weight.

13. A sealing member according to claim 12, wherein the hydrogenated aromatic epoxy resin comprises a resin of the general formula:

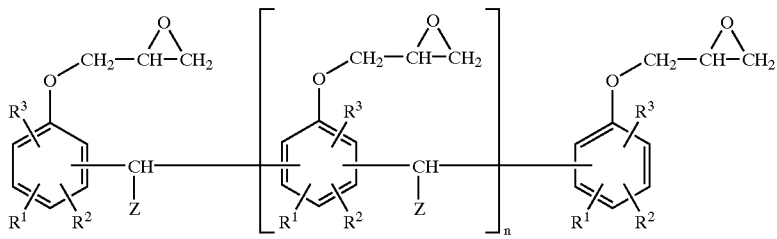

wherein $R^1$, $R^2$, and $R^3$ are each independently a hydrogen atom or an alkyl group having 1 to 4 carbon atoms, n is an integer from 0 to 10, and Z is a hydrogen atom or a group having the formula:

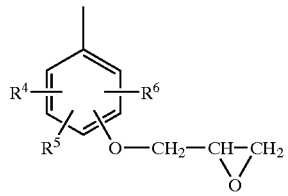

wherein $R^4$, $R^5$, and $R^6$ are each independently a hydrogen atom or an alkyl group having 1–4 carbon atoms.

14. A process for producing a sealing member according to claim 11, comprising:

providing an aromatic epoxy resin comprising one or more members selected from the group consisting of a bisphenol epoxy resin, a novolac epoxy resin and a multifunctional epoxy resin;

providing a carrier having a surface area in a range from 10 $m^2/g$ to 400 $m^2/g$, the carrier including graphite and rhodium or ruthenium; and reacting the aromatic epoxy resin with an organic solvent having at least one ether group in the presence of the carrier under elevated temperature and pressure conditions for a period of time.

15. A process for producing a sealing member according to claim 14, wherein the elevated temperature and pressure conditions comprise a temperature in the range of 30 to 150° C., a pressure in the range of 1 to 30 MPa, and a period of time in the range of 1 to 20 hours.

16. The light-emitting system of claim 1, wherein said light-transmissible member is cationically-polymerized using a sulfonium salt cationic polymerization catalyst.

17. The sealing member of claim 4, wherein said sealing member is cationically-polymerized using a sulfonium salt cationic polymerization catalyst.

18. The sealing member of claim 11, wherein said sealing member is cationically-polymerized using a sulfonium salt cationic polymerization catalyst.

* * * * *